United States Patent [19]
Werker et al.

[11] Patent Number: 5,856,762
[45] Date of Patent: Jan. 5, 1999

[54] PHASE-LOCKED LOOP WITH COURSE PROVIDING DAMPING AND NATURAL FREQUENCY INDEPENDENCE

[75] Inventors: Heinz Werker, Taufkirchen; Thomas Eichler, Unterhaching; Dirk Scheideler, Munich, all of Germany

[73] Assignee: Siemens Aktiengesellschaft, Munich, Germany

[21] Appl. No.: 898,516

[22] Filed: Jul. 22, 1997

[30] Foreign Application Priority Data

Jul. 22, 1996 [DE] Germany ................. 196 29 550.5

[51] Int. Cl.[6] .................. H03L 7/087; H03L 7/095; H03L 7/107

[52] U.S. Cl. .................. 331/11; 331/14; 331/17; 331/25; 331/DIG. 2; 327/156

[58] Field of Search .................. 331/1 A, 11, 14, 331/17, 25, 34, 57, DIG. 2; 327/147–150, 156–159

[56] References Cited

U.S. PATENT DOCUMENTS

| | | | |
|---|---|---|---|
| 3,401,353 | 9/1968 | Hughes | 331/11 |
| 5,144,156 | 9/1992 | Kawasaki | 307/262 |
| 5,363,419 | 11/1994 | Ho | 375/120 |
| 5,382,922 | 1/1995 | Gersbach et al. | 331/1 A |
| 5,491,439 | 2/1996 | Kelkar | 327/157 |
| 5,703,539 | 12/1997 | Gillig et al. | 331/16 |

OTHER PUBLICATIONS

"A Low Jitter 5 MHz to 180 MHz Clock Synthesizer for Video Graphics" (Shariatdoust et al.), dated May 3, 1992, pp. 24.2.1–24.2.5 IEEE 1992 Custom Integrated Circuits Conference.

"Low–Jitter and Process–Independent DLL and PLL based on Self–Biased Techniques" (Maneatis), dated Feb. 1996, vol. 39, pp. 130–131 1996 IEEE International Solid–State Circuits Conference.

*Primary Examiner*—David Mis
*Attorney, Agent, or Firm*—Herbert L. Lerner; Laurence A. Greenberg

[57] ABSTRACT

A phase-locked loop includes a switched phase detector, a loop filter and an oscillator connected in series, as well as a device for technology compensation, in particular a course control device. An operating point is adjusted during a starting phase of the phase-locked loop through the use of the course control device in such a way that the damping and natural frequency of the phase-locked loop is independent of fluctuations in technology parameters.

13 Claims, 1 Drawing Sheet

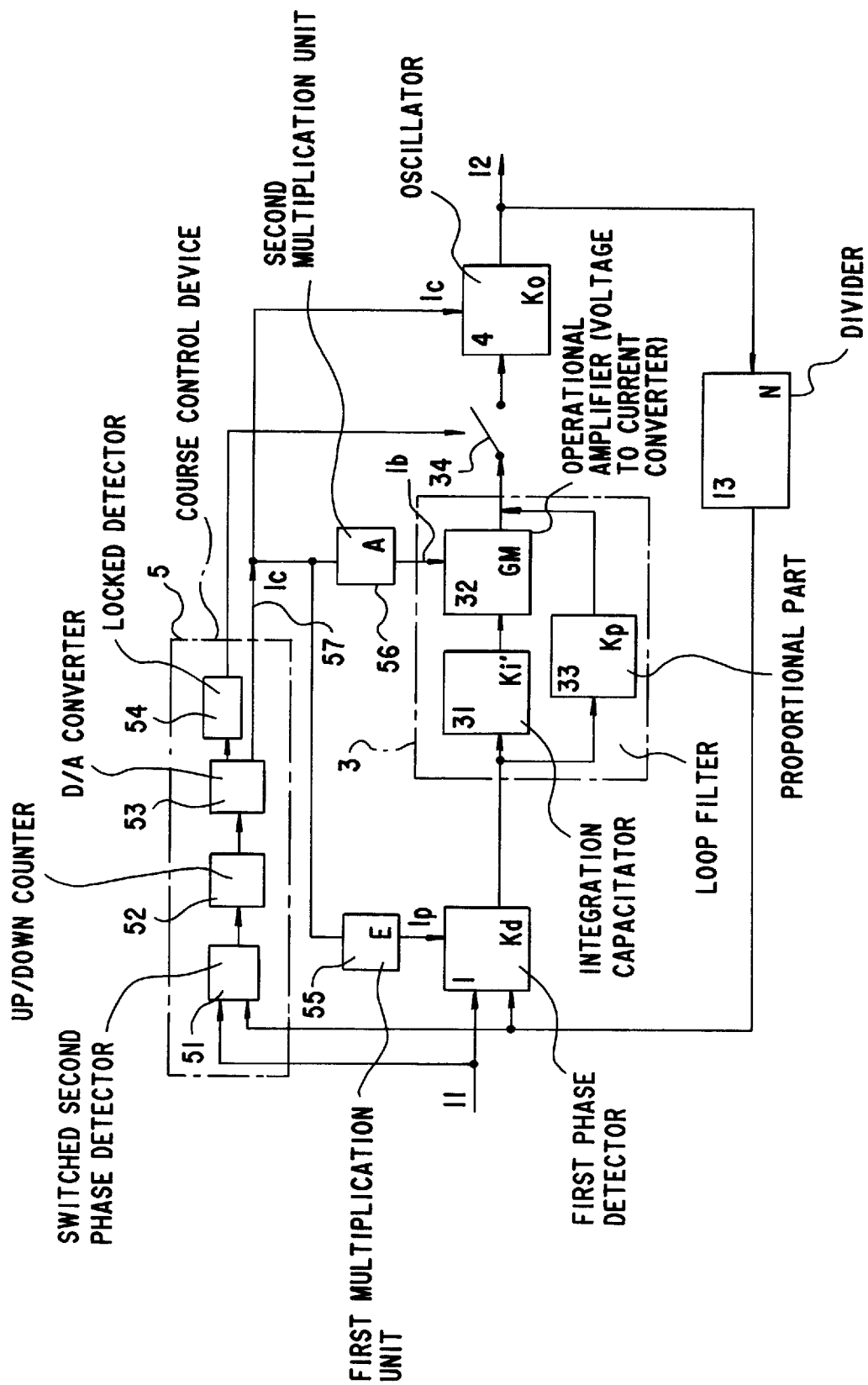

PHASE-LOCKED LOOP WITH COURSE PROVIDING DAMPING AND NATURAL FREQUENCY INDEPENDENCE

BACKGROUND OF THE INVENTION

1. Field of the Invention

The invention relates to a phase-locked loop with a phase detector, a loop filter and an oscillator connected in series.

In a phase-locked loop (PLL), an oscillator is synchronized to the phase of an input signal. The basic configuration of a PLL is known, for instance, from the book by Tietze and Schenk, entitled: Electronic Circuits, 1991, especially FIG. 27.20.

The characteristic variables of a PLL are its natural frequency and its damping. In a PLL constructed in the form of integrated circuits, those variables are dependent on the technology, among other factors, and can accordingly fluctuate over a range of about ±50%. Those inaccuracies, for instance in frequency synthesis with PLL, lead to increased jitter or instability of the circuit. The critical point in that case is the damping. The damping should be at least 0.7 in order to assure the stability of the PLL. With the usual technology-dependent tolerances, the damping would have to be oversized to from 2 to 4 times the normal value.

One approach for solving that problem in the prior art is known, for instance, from U.S. Pat. No. 5,491,439. FIG. 1 of that patent indicates a PLL of that generic type. After the operating point has been adjusted, the damping is lowered by current switchover, which leads to a reduced amount of jitter.

SUMMARY OF THE INVENTION

It is accordingly an object of the invention to provide a PLL with technology compensation, which overcomes the hereinafore-mentioned disadvantages of the heretofore-known devices of this general type and in which inaccuracies resulting from fluctuations of technology parameters are reduced.

With the foregoing and other objects in view there is provided, in accordance with the invention, a phase-locked loop, comprising a switched first phase detector; a loop filter connected in series with the phase detector; an oscillator connected in series with the loop filter; and a course control device adjusting an operating point during a starting phase of the phase-locked loop for making a damping and a natural frequency of the phase-locked loop independent of fluctuations in technology parameters.

In accordance with another feature of the invention, the course control device is a digital phase-locked loop.

In accordance with a further feature of the invention, the course control device has a series circuit including a second phase detector, an up/down counter and a digital/analog converter, and there are provided multiplication devices connected downstream of the series circuit.

In accordance with an added feature of the invention, the first phase detector and the course control device simultaneously receive a phase-locked loop input signal and a reference signal.

In accordance with an additional feature of the invention, the oscillator receives an output signal of the course control device, and there is provided a first multiplication device through which the output signal of the course control device is fed into the phase detector, and a second multiplication device through which the output signal of the course control device is fed into the loop filter.

In accordance with yet another feature of the invention, the output signal of the course control device is multiplied in the first multiplication device by a first factor corresponding to a ratio between a control current of the oscillator and an output current of the phase detector, and the output signal of the course control device is multiplied in the second multiplication device by a second factor corresponding to a ratio between the control current of the oscillator and a bias current of the loop filter.

In accordance with yet a further feature of the invention, the course control device includes a locked detector device connected downstream of the digital/analog converter and having an output, and there is provided a switch connected between the loop filter and the oscillator and triggered by the output of the locked detector device.

In accordance with yet an added feature of the invention, the switch is a filter with an enable function.

In accordance with yet an additional feature of the invention, the phase-locked loop has an operating phase besides the starting phase; the up/down counter has a counter state; during the starting phase of the phase-locked loop, the counter state of the up/down counter is not locked in and the locked detector device transmits a control signal for opening the switch; and during the operating phase of the phase-locked loop, the counter state of the up/down counter is locked in and the locked detector device transmits a control signal for closing the switch.

In accordance with again another feature of the invention, the oscillator is a current-controlled oscillator, in particular a ring oscillator.

In accordance with again a further feature of the invention, the loop filter has a proportional part device supplying an output current and an operational amplifier supplying an output current, and the output currents of the proportional part device and the operational amplifier are added together and fed to the current-controlled oscillator.

In accordance with a concomitant feature of the invention, the loop filter is a passive low-pass filter.

The advantages attained are in particular that through the use of the PLL of the invention, fluctuations in the natural frequency and the damping are reduced markedly. Since technology fluctuations are already compensated for by a course control, the filter of the PLL can be realized with a smaller integration capacitance. This economizes further on chip surface area.

Other features which are considered as characteristic for the invention are set forth in the appended claims.

Although the invention is illustrated and described herein as embodied in a phase-locked loop with technology compensation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The figure of the drawing is a block circuit diagram of a PLL with course control according to the invention.

DESCRIPTION OF THE PREFERRED EMBODIMENTS

Referring now in detail to the single figure of the drawing, there is seen a PLL according to the invention, which has a first phase detector 1, a loop filter 3, an oscillator 4 and a divider 13, connected in series. The phase detector has a gain factor with a value Kd; the oscillator has a gain factor with a value Ko; and the divider has a factor N. An oscillator output signal 12 which is divided downward by the divider 13, is coupled together with a PLL input signal 11 into the first phase detector 1. An output signal of the first phase detector 1 triggers the loop filter 3. An output signal of the loop filter 3 is injected into the oscillator 4, when a switch 34 is closed.

In the first phase detector 1, the frequency of the PLL input signal 11 is compared with the frequency of the oscillator output signal 12 divided downward by the divider 13. A signal corresponding to a frequency difference is delivered from the output side of the first phase detector to the loop filter 3. The current pulses on the output side of the phase detector increase or decrease the potential at the loop filter depending on the phase relationship of the PLL input signal and the oscillator output signal.

The loop filter 3 in particular is constructed as a passive low-pass filter. The low-pass filter has an integral part and a proportional part. The filter constants of the integral part and the proportional part have the values Ki=Ki'*GM and Kp, respectively, where GM is the gain factor of an operational amplifier. The integral part of the low-pass filter essentially has an integration capacitor 31 with an operational amplifier 32 connected to its output side. The operational amplifier functions as a current-to-voltage converter. In integrated circuit technology, it is difficult for the resistance of a proportional part 33 of the low-pass filter to be realized sufficiently accurately, because of technology fluctuations. For this reason, a current corresponding to the proportional part 33 of the low-pass filter is added to an output current of the voltage-to-current converter 32. The resultant current is injected into the oscillator 4. A current-controlled oscillator and in particular a ring oscillator is used as the oscillator 4. Elements of the ring oscillator, in particular transistors and capacitors, and the gain factor GM of the operational amplifier, are highly technology-dependent.

In addition, the oscillator output signal 12 which is divided downward by the divider 13 is delivered together with the PLL input signal 11 to a course control or closed-loop control device 5. The course control device is preferably constructed as a digital PLL. The course control device includes a switched second phase detector 51, an up/down counter 52 and a digital/analog converter 53, connected in series. An output signal 57 with a current value Ic of the digital/analog converter is injected into the oscillator 4. The output signal 57 is also injected into the first phase detector 1 and the loop filter 3 through respective first and second multiplication units 55 and 56. In addition, the course control device 5 includes a locked detector 54 which is connected to the output side of the digital/analog converter 53 and has an output side that triggers the switch 34. The function of the switch is preferably realized by a filter with an enable function.

The frequencies of the PLL input signal 11 and of the oscillator output signal 12 that is divided downward by the divider 13 are compared with one another in the second phase detector 51. The output side of the second phase detector 51 furnishes an output signal proportional to the frequency difference. This output signal is delivered to the up/down counter 52. The up/down counter assigns an appropriate numerical value to the frequency difference. This numerical value is delivered to the digital/analog converter 53. The output signal of the digital/analog converter is injected into the oscillator 4. The current Ic which is injected into the oscillator establishes the desired frequency of the current controlled oscillator. This counter state is thus a measure of the deviation in the technology-dependent parameters of the current controlled oscillator and if needed can additionally be used for evaluation when the circuit is tested.

During the course control, the switch 34 is open and therefore the fine control is deactivated. In the immediate starting phase, the phase-locked loop is not yet in the steady state. This means that the frequency differences or phase relationships of the input signal and output signal of the PLL have not yet stabilized at a constant value. In this situation, the up/down counter has not yet locked in. The locked detector 54 downstream of the up/down counter 52 ascertains whether or not the up/down counter has locked in. The locked detector then sends a control signal to close the switch. In the ensuing phase of operation, the up/down counter is locked in. In other words, the numerical value of the up/down counter no longer changes. In the operating phase, the operating point of the PLL, or the desired frequency for the oscillator, is adjusted. The fine control is switched on by the closure of the switch. The fine control compensates for slight fluctuations, such as temperature fluctuations and fluctuations in the supply voltage.

The output current 57 of the course control device is multiplied by a factor E in the first multiplication device 55. The factor E is equivalent to a ratio between the control current of the oscillator and the output current of the first phase detector. A current with a current value Ip is delivered from the output side of the first multiplication device to the first phase detector. The output current of the course control device is multiplied by a factor A in the second multiplication device 56. The factor A corresponds to a ratio between the control current of the oscillator and a bias current of the operational amplifier. A current with a current value Ib is delivered from the output side of the second multiplication device 56 to the operational amplifier 32 of the loop filter 3.

Thus through the use of the course control, an operating point adjustment is carried out, which varies the individual currents in a fixed ratio to one another and thus does not affect the damping or the natural frequency of the PLL.

Only the course control is active during the starting phase of the PLL. The current operating point is thus adjusted for the fine control that functions subsequently, as a function of the technology, the instantaneous temperature, and the supply voltage. The course control functions as a digital PLL. The fine control that is active in the ensuing operating phase has the task of compensating for later fluctuations in temperature and supply voltage. Since technology fluctuations are already compensated for by the course control, it is possible to realize the low-pass filter with a smaller integration capacitance than would otherwise be necessary. This saves additional chip surface area.

Illustrated below is a derivation for the way in which the damping and the natural frequency are adjusted by the above-described circuit technology, regardless of technology parameters. In general, for a damping D and a natural frequency wn, the following equations apply:

$$wn = \sqrt{\frac{Kd \times Ko \times Ki}{N}} \quad (1)$$

$$D = \frac{Kp}{2} \sqrt{\frac{Kd \times Ko}{Ki \times N}} \quad (2)$$

In this case Kd is the gain factor of the phase detector, Ko is the gain factor of the oscillator, Ki and Kp are the integral and proportional filter factors, respectively, and N is the divider factor. The following constants and ratios are also defined as follows:

$$Kd = \frac{Ip}{2\pi} \quad (3)$$

$$Ki = \frac{GM}{Cfil} = \frac{\sqrt{Ib \times Kt \times F}}{Cfil} \quad (4)$$

$$Ko = \frac{1}{2 \times Co} \sqrt{\frac{Kt}{Ic}} \quad (5)$$

$$Cfil = Co \times B = \frac{\sqrt{Ic \times Kt}}{wo} B \quad (6)$$

$$Ib = \frac{Ic}{A} \quad (7)$$

$$Ip = \frac{Ic}{E} \quad (8)$$

In this case Kt is the transistor constant, F is the ratio of width to length of the transistors of the oscillator and the low-pass filter, Cfil is the integration capacitance of the filter, Co is the load capacitance of the oscillator, B is the ratio of the load capacity of the oscillator and the integration capacitance of the filter, and wo is the oscillator frequency.

With the equations 1–8, the following equations are obtained for the natural frequency and for the damping:

$$wn = \frac{wo}{2} \sqrt{\frac{1}{\pi BEN}} \sqrt[4]{\frac{A}{F}} \quad (9)$$

$$D = \frac{Kp}{4} \sqrt{\frac{B}{\pi EN}} \sqrt[4]{\frac{A}{F}} \quad (10)$$

The natural frequency wn is now dependent on the oscillator frequency wo, the width/length ratio F of the transistors of the oscillator and low-pass filter, the ratio E between the control current of the current-controlled oscillator and the output current of the first phase detector, the ratio A between the control current of the current controlled oscillator and the bias current of the low-pass filter, the ratio B between the load capacitance of the oscillator and the integration capacitance of the filter, and the divider factor N in the feedback branch of the PLL. The damping D is dependent on the above-described ratios and on the proportional factor Kp of the low-pass filter. The oscillator frequency, the proportional factor, and the divider factor are fixedly defined. The ratios between the currents or geometries can be adjusted with very high accuracy in integrated circuit technology. An adjustment is carried out through the use of this course control, so that the individual currents are varied in a fixed ratio to one another and thus do not affect the damping and the natural frequency of the PLL.

We claim:

1. A phase-locked loop, comprising:
   a switched phase detector;
   a loop filter connected in series with said phase detector;
   an oscillator connected in series with said loop filter; and
   a course control device adjusting an operating point during a starting phase of the phase-locked loop for making a damping and a natural frequency of the phase-locked loop independent of fluctuations in technology parameters.

2. The phase-locked loop according to claim 1, wherein said course control device is a digital phase-locked loop.

3. The phase-locked loop according to claim 1, wherein said course control device has a series circuit including another phase detector, an up/down counter and a digital/analog converter, and including multiplication devices connected downstream of said series circuit.

4. The phase-locked loop according to claim 1, wherein said phase detector and said course control device simultaneously receive a phase-locked loop input signal and a reference signal.

5. The phase-locked loop according to claim 1, wherein said oscillator receives an output signal of said course control device, and including a first multiplication device through which the output signal of said course control device is fed into said phase detector, and a second multiplication device through which the output signal of said course control device is fed into said loop filter.

6. The phase-locked loop according to claim 5, wherein the output signal of said course control device is multiplied in said first multiplication device by a first factor corresponding to a ratio between a control current of said oscillator and an output current of said phase detector, and the output signal of said course control device is multiplied in said second multiplication device by a second factor corresponding to a ratio between the control current of said oscillator and a bias current of said loop filter.

7. The phase-locked loop according to claim 1, wherein said course control device includes a locked detector device connected downstream of said digital/analog converter and having an output, and including a switch connected between said loop filter and said oscillator and triggered by the output of said locked detector device.

8. The phase-locked loop according to claim 7, wherein said switch is a filter with an enable function.

9. The phase-locked loop according to claim 7, wherein:
   the phase-locked loop has an operating phase besides the starting phase;
   said up/down counter has a counter state;
   during the starting phase of the phase-locked loop, the counter state of said up/down counter is not locked in and said locked detector device transmits a control signal for opening said switch; and
   during the operating phase of the phase-locked loop, the counter state of said up/down counter is locked in and said locked detector device transmits a control signal for closing said switch.

10. The phase-locked loop according to claim 1, wherein said oscillator is a current-controlled oscillator.

11. The phase-locked loop according to claim 1, wherein said oscillator is a ring oscillator.

12. The phase-locked loop according to claim 10, wherein said loop filter has a proportional part device supplying an output current and an operational amplifier supplying an output current, and the output currents of said proportional part device and said operational amplifier are added together and fed to said current-controlled oscillator.

13. The operational amplifier according to claim 1, wherein said loop filter is a passive low-pass filter.

* * * * *